(12) United States Patent
Fratin et al.

(10) Patent No.: US 11,417,394 B2
(45) Date of Patent: Aug. 16, 2022

(54) DECODING FOR A MEMORY DEVICE

(71) Applicant: Micron Technology, Inc., Boise, ID (US)

(72) Inventors: Lorenzo Fratin, Buccinasco (IT); Paolo Fantini, Vimercate (IT); Fabio Pellizzer, Boise, ID (US); Thomas M. Graettinger, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 31 days.

(21) Appl. No.: 17/118,844

(22) Filed: Dec. 11, 2020

(65) Prior Publication Data
US 2022/0189549 A1 Jun. 16, 2022

(51) Int. Cl.
*G11C 8/00* (2006.01)
*G11C 13/00* (2006.01)

(52) U.S. Cl.
CPC ........ *G11C 13/0023* (2013.01); *G11C 13/003* (2013.01); *G11C 13/0004* (2013.01)

(58) Field of Classification Search
CPC ............ G11C 13/0023; G11C 13/0004; G11C 13/003
USPC ................................... 365/230.06
See application file for complete search history.

(56) References Cited

U.S. PATENT DOCUMENTS

| | | | | |
|---|---|---|---|---|
| 5,808,338 A | * | 9/1998 | Gotou | G11C 16/0416 257/318 |
| 6,909,660 B2 | * | 6/2005 | Oh | G11C 8/08 365/230.06 |
| 2006/0140004 A1 | | 6/2006 | Shukuri et al. | |
| 2008/0123415 A1 | | 5/2008 | Frulio et al. | |
| 2020/0294583 A1 | | 9/2020 | Miyazaki | |
| 2020/0327931 A1 | | 10/2020 | Cosemans et al. | |

FOREIGN PATENT DOCUMENTS

KR 10-0758299 B1 9/2007

OTHER PUBLICATIONS

"International Search Report and Written Opinion of the International Searching Authority," issued in connection with Int'l Appl. No. PCT/US21/72697, dated Apr. 5, 2022 (9 pages).

* cited by examiner

*Primary Examiner* — Vu A Le
(74) *Attorney, Agent, or Firm* — Holland & Hart LLP

(57) ABSTRACT

Methods, systems, and devices for decoding for a memory device are described. A decoder of a memory device may include transistors in a first layer between a memory array and a second layer that includes one or more components associated with the memory array. The second layer may include CMOS pre-decoding circuitry, among other components. The decoder may include CMOS transistors in the first layer. The CMOS transistors may control which voltage source is coupled with an access line based on a gate voltage applied to a p-type transistor and a n-type transistor. For example, a first gate voltage applied to a p-type transistor may couple a source node with the access line and bias the access line to a source voltage. A second gate voltage applied to the n-type transistor may couple a ground node with the access line and bias the access line to a ground voltage.

25 Claims, 6 Drawing Sheets

DECODING FOR A MEMORY DEVICE

FIELD OF TECHNOLOGY

The following relates generally to one or more systems for memory and more specifically to decoding for a memory device.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

Improving memory devices, generally, may include increasing memory cell density, increasing read/write speeds, increasing reliability, increasing data retention, reducing power consumption, or reducing manufacturing costs, among other metrics. Solutions for saving space in the memory array, increasing the memory cell density, or decreasing overall power usage of the memory array with three-dimensional vertical architecture may be desired.

DETAILED DESCRIPTION

In some examples, scaling down the size of memory cells in a memory array may have one or more advantages for a memory device. For example, by scaling down the size of the memory cells, the overall size of the memory array may also be reduced. However, one or more layers of the memory device may not scale with the size of the memory cells. For example, a complementary metal-oxide-semiconductor (CMOS) under array (CuA) layer may include one or more components that may not be efficiently scaled down or sized similarly as the memory array. The CuA layer may include a decoder that is configured to bias one or more access lines (e.g., digit lines, word lines) coupled with memory cells of the memory array. As such, the amount by which memory cells are scaled may be limited by a size of the decoder or other components that support the memory array.

To enable sufficient space for the decoder as the memory array is scaled down, the decoder may include transistors in a layer between the memory array and the CuA layer. The layer may also include CMOS pre-decoding circuitry. In some examples, the decoder may include CMOS transistors, where the CMOS transistors may bias access lines of the memory array to one or more voltages (e.g., a source voltage or a ground voltage) during an access operation. A CMOS transistor may include a p-type transistor and an n-type transistor with gates coupled to a common voltage source (e.g., a gate node). In some examples, the p-type transistor may be referred to as a p-type metal-oxide-semiconductor (PMOS) field effect transistor (FET), and the n-type transistor may be referred to as an n-type metal-oxide-semiconductor (NMOS) FET. The CMOS transistor may control which voltage source is coupled with an access line based on a gate voltage applied to the p-type transistor and the n-type transistor. For example, a first gate voltage applied to the CMOS transistor may activate the p-type transistor, which may couple a source node with the access line and bias the access line to a source voltage. Similarly, a second gate voltage applied to the CMOS transistor may activate the n-type transistor, which may couple a ground node with the access line and bias the access line to a ground voltage. In some examples, the transistors may include thin film transistors (TFTs), such as planar TFTs.

Features of the disclosure are initially described in the context of a memory die as described with reference to FIG. 1. Features of the disclosure are described in the context of different views of example memory arrays, decoders, and memory devices as described with reference to FIGS. 2-4. These and other features of the disclosure are further illustrated by and described with reference to an apparatus diagram and a flowchart that relate to decoding for a memory device as described with references to FIGS. 5 and 6.

Figure 1:
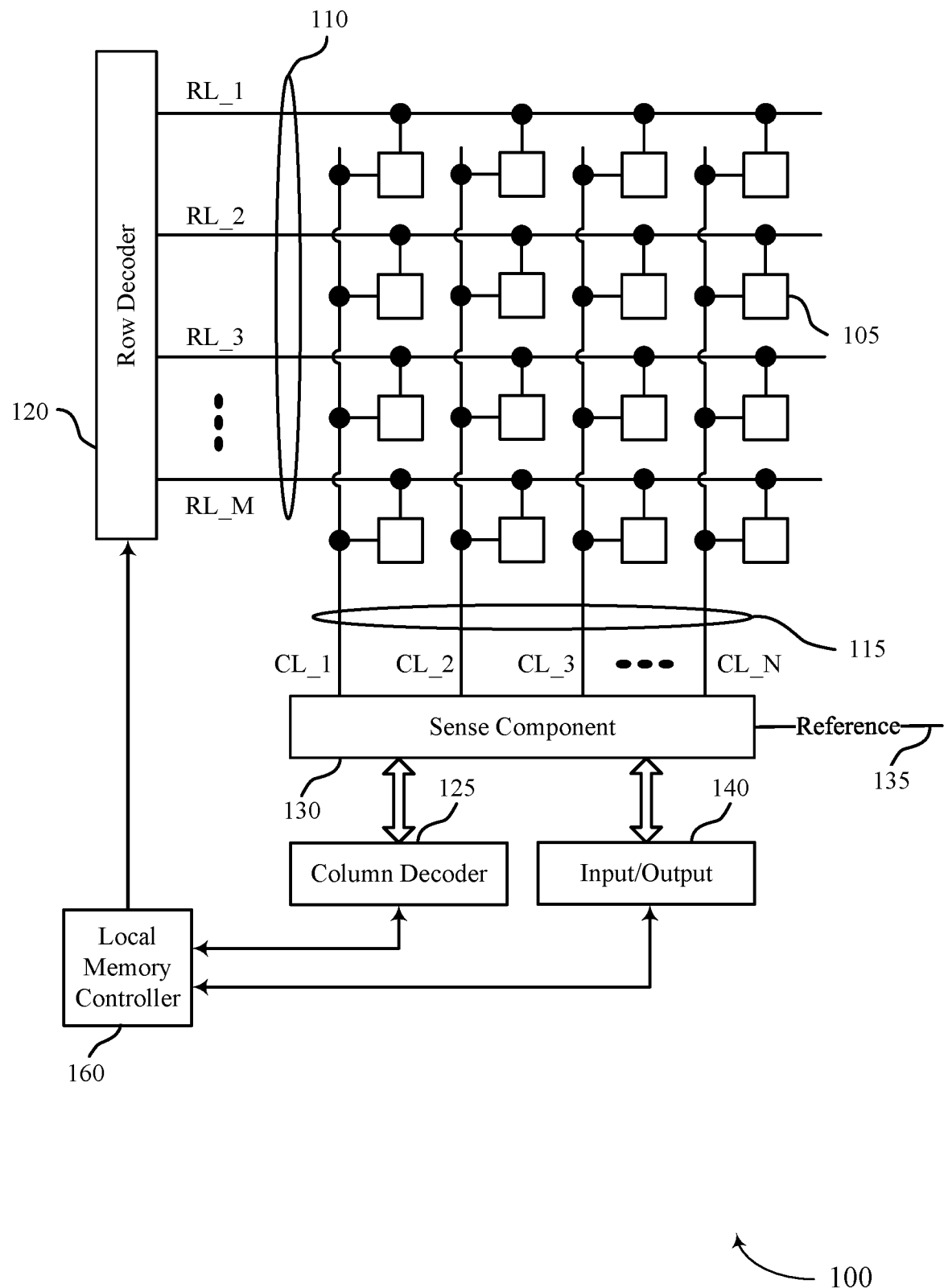
FIG. 1 illustrates an example of a memory die that supports decoding for a memory device in accordance with examples as disclosed herein.

FIG. 1 illustrates an example of a memory die 100 that supports decoding for a memory device in accordance with examples as disclosed herein. In some examples, the memory die 100 may be referred to as a memory chip, a memory device, or an electronic memory apparatus. The memory die 100 may include one or more memory cells 105 that may each be programmable to store different logic states (e.g., a programmed one of a set of two or more possible states). For example, a memory cell 105 may be operable to store one bit of information at a time (e.g., a logic 0 or a logic 1). In some examples, a memory cell 105 (e.g., a multi-level memory cell 105) may be operable to store more than one bit of information at a time (e.g., a logic 00, logic 01, logic 10, a logic 11).

A memory cell 105 may store a logic state using a configurable material, which may be referred to as a memory element, a memory storage element, a material element, a material memory element, a material portion, or a polarity-written material portion, among others. A configurable material of a memory cell 105 may refer to a chalcogenide-based storage component, as described in more detail with reference to FIG. 3. For example, a chalcogenide storage element may be used in a phase change memory (PCM) cell, a thresholding memory cell, or a self-selecting memory cell.

The memory die 100 may include the access lines (e.g., row lines 110 and the column lines 115) arranged in a pattern, such as a grid-like pattern. Access lines may be formed of one or more conductive materials. In some examples, row lines 110 may be referred to as word lines. In some examples, column lines 115 may be referred to as digit lines or bit lines. References to access lines, row lines, column lines, word lines, digit lines, or bit lines, or their analogues, are interchangeable without loss of understanding or operation. Memory cells 105 may be positioned at intersections of the row lines 110 and the column lines 115.

Operations such as reading and writing may be performed on the memory cells 105 by activating or selecting access lines such as one or more of a row line 110 or a column line 115. By biasing a row line 110 and a column line 115 (e.g., applying a voltage to the row line 110 or the column line 115), a single memory cell 105 may be accessed at their intersection. The intersection of a row line 110 and a column line 115 in either a two-dimensional or three-dimensional configuration may be referred to as an address of a memory cell 105. An access line may be a conductive line coupled with a memory cell 105 and may be used to perform access operations on the memory cell 105.

Accessing the memory cells 105 may be controlled through a row decoder 120 or a column decoder 125. For example, a row decoder 120 may receive a row address from a local memory controller 160 and activate a row line 110 based on the received row address. A column decoder 125 may receive a column address from the local memory controller 160 and may activate a column line 115 based on the received column address.

The sense component 130 may be operable to detect a state (e.g., a material state, a resistance, a threshold state) of a memory cell 105 and determine a logic state of the memory cell 105 based on the stored state. The sense component 130 may include one or more sense amplifiers to amplify or otherwise convert a signal resulting from accessing the memory cell 105. The sense component 130 may compare a signal detected from the memory cell 105 to a reference 135 (e.g., a reference voltage). The detected logic state of the memory cell 105 may be provided as an output of the sense component 130 (e.g., to an input/output 140), and may indicate the detected logic state to another component of a memory device that includes the memory die 100.

The local memory controller 160 may control the accessing of memory cells 105 through the various components (e.g., row decoder 120, column decoder 125, sense component 130). In some examples, one or more of the row decoder 120, column decoder 125, and sense component 130 may be co-located with the local memory controller 160. The local memory controller 160 may be operable to receive one or more of commands or data from one or more different memory controllers (e.g., an external memory controller 120 associated with a host device 105, another controller associated with the memory die 100), translate the commands or the data (or both) into information that can be used by the memory die 100, perform one or more operations on the memory die 100, and communicate data from the memory die 100 to a host device 105 based on performing the one or more operations. The local memory controller 160 may generate row signals and column address signals to activate the target row line 110 and the target column line 115. The local memory controller 160 may also generate and control various voltages or currents used during the operation of the memory die 100. In general, the amplitude, the shape, or the duration of an applied voltage or current discussed herein may be varied and may be different for the various operations discussed in operating the memory die 100.

The local memory controller 160 may be operable to perform one or more access operations on one or more memory cells 105 of the memory die 100. Examples of access operations may include a write operation, a read operation, a refresh operation, a precharge operation, or an activate operation, among others. In some examples, access operations may be performed by or otherwise coordinated by the local memory controller 160 in response to various access commands (e.g., from a host device 105). The local memory controller 160 may be operable to perform other access operations not listed here or other operations related to the operating of the memory die 100 that are not directly related to accessing the memory cells 105.

The local memory controller 160 may be operable to perform a write operation (e.g., a programming operation) on one or more memory cells 105 of the memory die 100. During a write operation, a memory cell 105 of the memory die 100 may be programmed to store a desired logic state. The local memory controller 160 may identify a target memory cell 105 on which to perform the write operation. The local memory controller 160 may identify a target row line 110 and a target column line 115 coupled with the target memory cell 105 (e.g., the address of the target memory cell 105). The local memory controller 160 may activate the target row line 110 and the target column line 115 (e.g., applying a voltage to the row line 110 or column line 115) to access the target memory cell 105. The local memory controller 160 may apply a specific signal (e.g., write pulse) to the column line 115 during the write operation to store a specific state in the storage element of the memory cell 105. The pulse used as part of the write operation may include one or more voltage levels over a duration.

The local memory controller 160 may be operable to perform a read operation (e.g., a sense operation) on one or more memory cells 105 of the memory die 100. During a read operation, the logic state stored in a memory cell 105 of the memory die 100 may be determined. The local memory controller 160 may identify a target memory cell 105 on which to perform the read operation. The local memory controller 160 may identify a target row line 110 and a target column line 115 coupled with the target memory cell 105 (e.g., the address of the target memory cell 105). The local memory controller 160 may activate the target row line 110 and the target column line 115 (e.g., applying a voltage to the row line 110 or column line 115) to access the target memory cell 105. The sense component 130 may detect a signal received from the memory cell 105 that is based on the pulse applied to the row line 110, the pulse applied to the column line, and/or a resistance or threshold characteristic of the memory cell 105. The sense component 130 may amplify the signal. The local memory controller 160 may activate the sense component 130 (e.g., latch the sense component) and thereby compare the signal received from the memory cell 105 to the reference signal 135. Based on that comparison, the sense component 130 may determine a logic state that is stored on the memory cell 105. The pulse used as part of the read operation may include one or more voltage levels over a duration.

In some examples, the memory die 100 may be include a CuA layer (not shown). The CuA layer may include a decoder (e.g., the row decoder 120 or the column decoder 125) that is configured to bias one or more access lines (e.g., column lines 115 or row lines 110) coupled with memory cells 105 of a memory array. To enable sufficient space for the decoder as the memory array is scaled down, the decoder may include transistors in a layer between the memory array and the CuA layer. The layer may also include CMOS pre-decoding circuitry In some examples, the decoder may include CMOS transistors, where the CMOS transistors may bias access lines of the memory array to one or more voltages (e.g., a source voltage or a ground voltage) during an access operation. Each CMOS transistor may include a p-type transistor and an n-type transistor, where gates of the p-type transistor and the n-type transistor may be coupled with a common voltage source (e.g., a gate node). The CMOS transistor may control which voltage source is coupled with an access line based on a gate voltage applied to the p-type transistor and the n-type transistor by the gate node. For example, a first gate voltage applied to the CMOS transistor may activate the p-type transistor, which may couple a source node with the access and bias the access line to a source voltage. Similarly, a second gate voltage applied to the CMOS transistor may activate the n-type transistor, which may couple a ground node with the access line and bias the access line to a ground voltage. In some examples, the transistors may include TFTs, such as planar TFTs.

Figure 2:
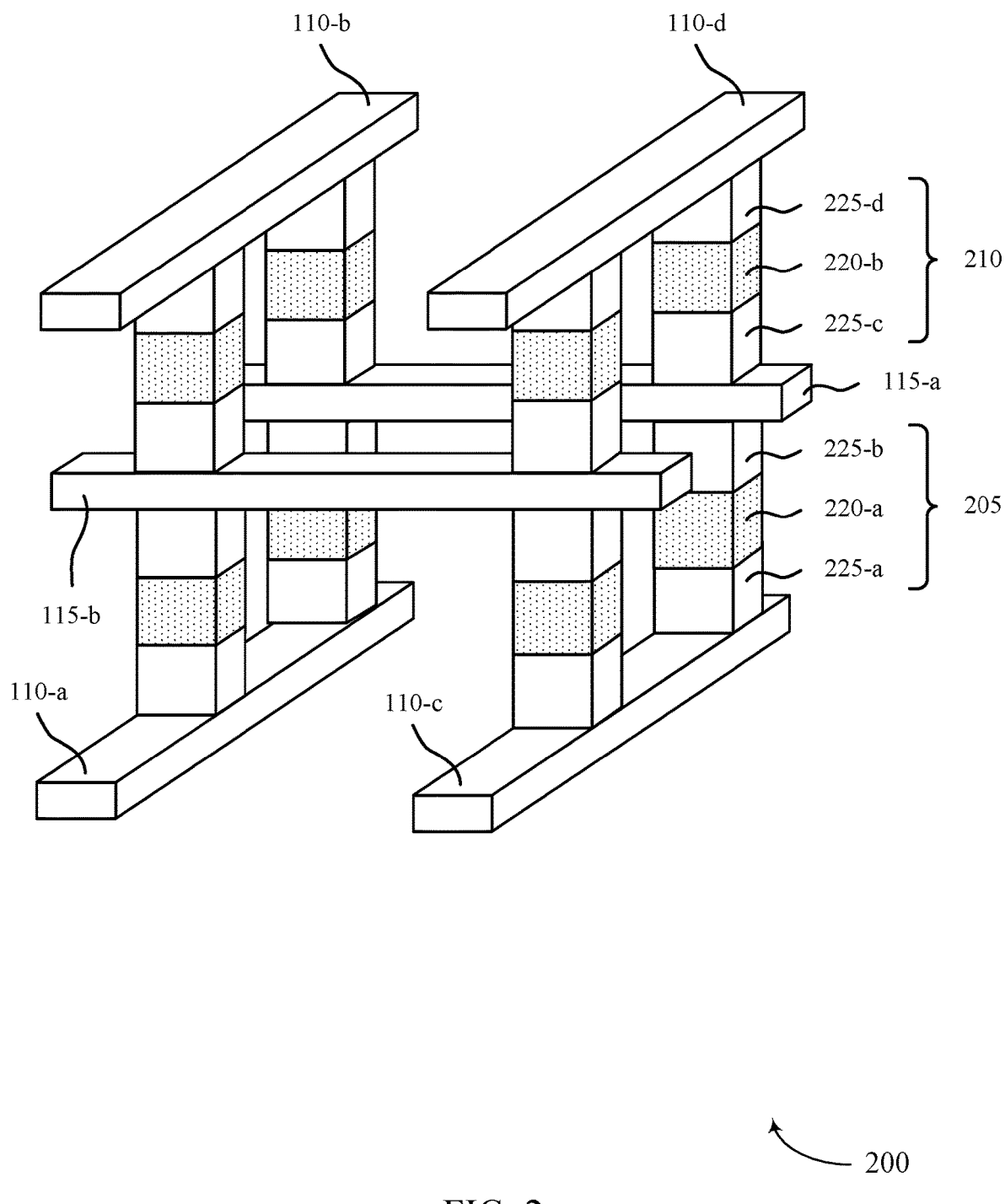
FIG. 2 illustrates an example of a memory array that support decoding for a memory device in accordance with examples as disclosed herein.

FIG. 2 illustrates an example of a memory array 200 in accordance with examples as disclosed herein. Memory array 200 may be an example of portions of the memory die described with reference to FIG. 1. The memory array 200 may include a first deck 205 of memory cells that is positioned above a substrate (not shown) and a second deck 210 of memory cells on top of the first array or deck 205. Though the example of memory array 200 includes two decks 205, 210, the memory array 200 may include any quantity of decks (e.g., one or more than two).

Memory array 200 may also include a row line 110-a, a row line 110-b, a row line 110-c, a row line 110-d, a column line 115-a, and a column line 115-b, which may be examples of row lines 110 and column lines 115, as described with reference to FIG. 1. One or more memory cells of the first deck 205 and the second deck 210 may include one or more chalcogenide materials in a pillar between access lines. For example, a single stack between access lines may include one or more of a first electrode, a first chalcogenide material (e.g., selector component), a second electrode, a second chalcogenide material (e.g., storage element), or a third electrode. Although some elements included in FIG. 2 are labeled with a numeric indicator, other corresponding elements are not labeled, although they are the same or would be understood to be similar, in an effort to increase visibility and clarity of the depicted features.

One or more memory cells of the first deck 205 may include one or more of an electrode 225-a, a storage element 220-a, or an electrode 225-b. One or more memory cells of the second deck 210 may include an electrode 225-c, a storage element 220-b, and an electrode 225-d. The storage elements 220 may be examples of a chalcogenide material, such as a phase change storage element, a thresholding storage element, or a self-selecting storage element. The memory cells of the first deck 205 and second deck 210 may, in some examples, have common conductive lines such that corresponding memory cells of one or more decks 205 and one or more decks 210 may share column lines 115 or row lines 110. For example, the first electrode 225-c of the second deck 210 and the second electrode 225-b of the first deck 205 may be coupled with column line 115-a such that the column line 115-a may be shared by vertically adjacent memory cells.

In some examples, the material of the storage element 220 may include a chalcogenide material or other alloy including selenium (Se), tellurium (Te), arsenic (As), antimony (Sb), carbon (C), germanium (Ge), silicon (Si), or indium (IN), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (Cl), or fluorine (F), each in atomic or molecular forms.

In some examples, the storage element 220 may be an example of a phase change memory cell. In such examples, the material used in the storage element 220 may be based on an alloy (such as the alloys listed above) and may be operated so as to undergo a phase change or change to different physical state during normal operation of the memory cell. For example, a phase change memory cell may have an amorphous state (e.g., a relatively disordered atomic configuration) and a crystalline state (e.g., a relatively ordered atomic configuration).

Phase change memory cells may exhibit an observable difference between resistances of a crystalline state and an amorphous state in phase change materials, which may be chalcogenide materials. A material in the crystalline state may have atoms arranged in a periodic structure, which may result in a relatively low electrical resistance. By contrast, a material in an amorphous state may have no or relatively little periodic atomic structure, which may have a relatively high electrical resistance.

The difference in resistance values between amorphous and crystalline states of a material may be substantial. For example, a material in an amorphous state may have a resistance one or more orders of magnitude greater than the resistance of the material in its crystalline state. In some examples, the material may be partially amorphous and partially crystalline, and the resistance may be of some value between the resistances of the material in a wholly crystalline or wholly amorphous state. In such examples, a material may be used to store more than two logic states (e.g., three or more logic states).

During a programming (write) operation of a phase change memory cell (e.g., electrode 225-a, storage element 220-a, electrode 225-b), the various parameters of the programming pulse may influence (e.g., determine, set, program) a particular behavior or characteristic of the material of the storage element 220, such as the threshold voltage of the material or the resistance of the material. To program a low-resistance state (e.g., a relatively crystalline state) in the phase change memory cell, a programming pulse may be applied that heats or melts the material of the storage element 220, which may be associated with forming, at least temporarily, a relatively disordered (e.g., amorphous) atomic arrangement. The amplitude of the programming pulse may be reduced (e.g., relatively slowly) over a duration to allow the material to form crystalline structures as it cools, thereby forming a stable crystalline material state. To program a high-resistance state (e.g., a relatively amorphous state) in the phase change memory cell, a programming pulse may be applied that heats and/or melts the material of the storage element 220. The amplitude of the programming pulse may be reduced more quickly than the programming pulse for the low-resistance state. In such scenarios, the material may cool with atoms in a more disordered atomic arrangement because the atoms were not able to form crystalline structures before the material reached a stable state, thereby forming a stable amorphous material state. The difference in threshold voltages or resistances of the material of the storage element 220 depending on the logic state stored by the material of the storage element 220 may correspond to the read window of the storage element 220. In some cases, a portion of a storage element may undergo a material change associated with the logic states.

In some examples, such as for thresholding memory cells or self-selecting memory cells, some or all of the set of logic states supported by the memory cells may be associated with an amorphous state of the chalcogenide material (e.g., the material in a single state may be operable to store different logic states). In some examples, the storage element 220 may be an example of a self-selecting memory cell. In such examples, the material used in the storage element 220 may be based on an alloy (such as the alloys listed above) and may be operated so as to undergo a change to different physical state during normal operation of the memory cell. For example, a self-selecting memory cell may have an high threshold voltage state and a low threshold voltage state. An high threshold voltage state may correspond to a first logic state (e.g., a RESET state) and a low threshold voltage state may correspond to a second logic state (e.g., a SET state).

During a programming (write) operation of a self-selecting memory cell (e.g., including electrode 225-*a*, storage element 220-*a*, and electrode 225-*b*), a polarity used for a write operation may influence (determine, set, program) a particular behavior or characteristic of the material of the storage element 220, such as the threshold voltage of the material. The difference in threshold voltages of the material of the storage element 220 depending on the logic state stored by the material of the storage element 220 (e.g., the difference between the threshold voltage when the material is storing a logic state '0' versus a logic state '1') may correspond to the read window of the storage element 220.

The architecture of memory array 200 may be referred to as a cross-point architecture, in some examples, in which a memory cell is formed at a topological cross-point between a row line 110 and a column line 115. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selector element. For example, DRAM may use a transistor, which is a three-terminal device, as the selector element for each memory cell and may have a larger memory cell area compared to the cross-point architecture.

While the example of FIG. 2 shows two memory decks, other configurations are possible. In some examples, a single memory deck of memory cells may be constructed above a substrate, which may be referred to as a two-dimensional memory. In some examples, two or more decks of memory cells may be configured in a similar manner in a three-dimensional cross point architecture. Further, in some cases, elements shown in or described with reference to FIG. 2 may be electrically coupled with one another as shown or described but rearranged physically (e.g., a storage element 220 and possibly a selection element or electrode 225 may be electrically in series between a row line 110 and a column line 115 but need not be in a pillar or stack configuration).

In some examples, the memory array 200 may be coupled with a CuA layer (not shown). The CuA layer may include a decoder that is configured to bias one or more access lines (e.g., column lines 115 or row lines 110) coupled with memory cells of the memory array 200. To enable sufficient space for the decoder as the memory array 200 is scaled down, the decoder may include transistors in a layer between the memory array 200 and the CuA layer. The layer may also include CMOS pre-decoding circuitry In some examples, the decoder may include CMOS transistors, where the CMOS transistors may bias access lines of the memory array 200 to one or more voltages (e.g., a source voltage or a ground voltage) during an access operation. Each CMOS transistor may include a p-type transistor and an n-type transistor, where gates of the p-type transistor and the n-type transistor may be coupled with a common voltage source (e.g., a gate node). The CMOS transistor may control which voltage source is coupled with an access line based on a gate voltage applied to the p-type transistor and the n-type transistor by the gate node. For example, a first gate voltage applied to the CMOS transistor may activate the p-type transistor, which may couple a source node with the access and bias the access line to a source voltage. Similarly, a second gate voltage applied to the CMOS transistor may activate the n-type transistor, which may couple a ground node with the access line and bias the access line to a ground voltage. In some examples, the transistors may include TFTs, such as planar TFTs.

Figure 3:
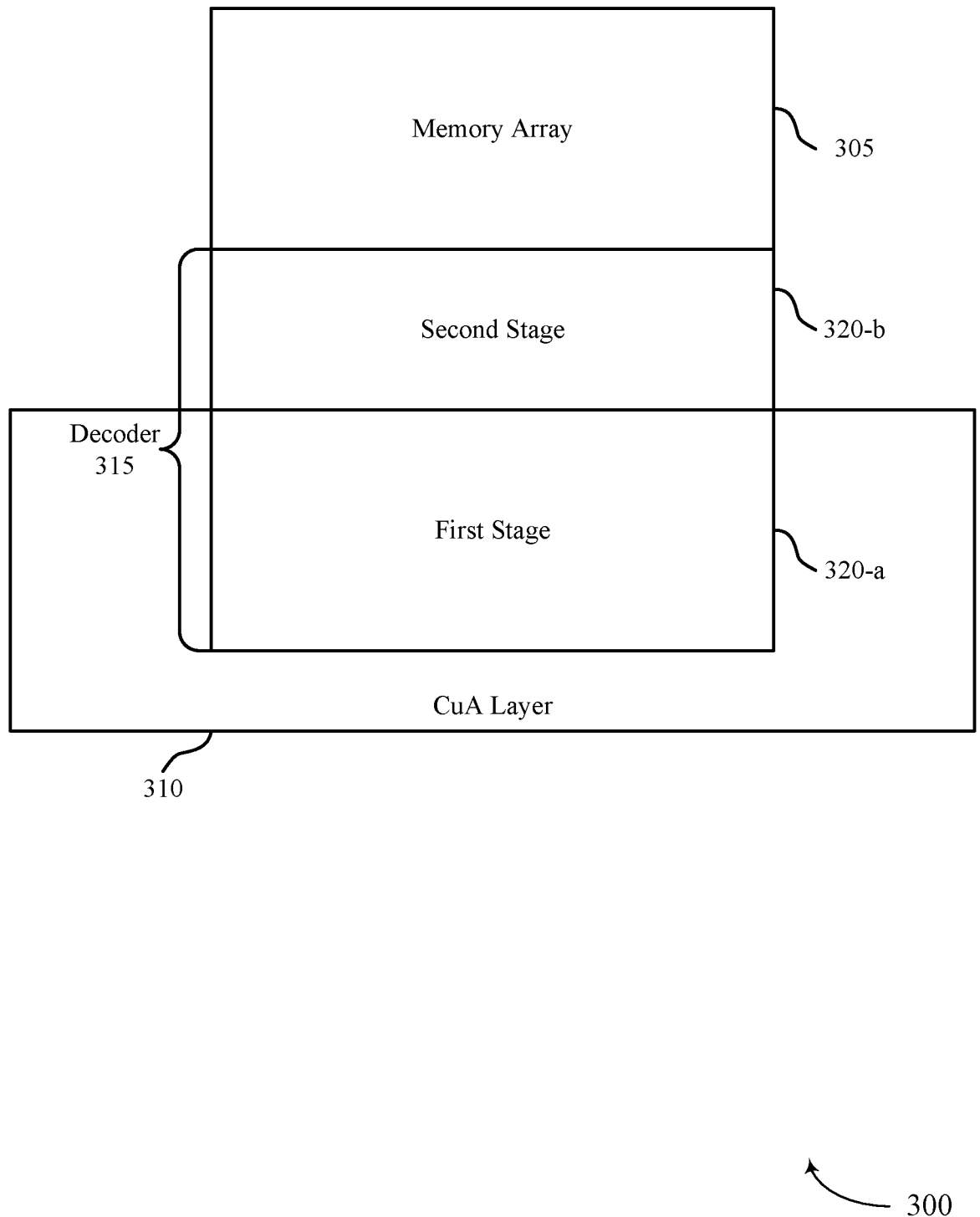
FIG. 3 illustrates an example of a block diagram that supports decoding for a memory device in accordance with examples as disclosed herein.

FIG. 3 illustrates an example of a block diagram 300 that supports decoding for a memory device in accordance with examples as disclosed herein. The block diagram 300 may include a memory array 305, which may be an example of a memory array 200 described with reference to FIG. 2. The block diagram 300 may also include a CuA layer 310, and a decoder 315.

The memory array 305 may include memory cells. In some examples, the memory cells may be arranged in decks, and may each have one or more self-selecting memory cells. The memory cells may be programmed or accessed via access lines (e.g., word lines and digit lines). The access lines may be biased to one or more voltages to access the memory cells for programming or access operations.

The decoder 315 may be configured to bias the access lines of the memory array 305 as a part of access operations. The decoder 315 may include a first stage 320-*a*, which may include CMOS pre-decoding circuitry, and a second stage 320-*b*, which may include transistors (e.g., TFTs) configured to couple the access lines to one or more voltage sources. For example, a first voltage source may be a source node and a second voltage source may be a ground node. In some examples, the transistors may be planar transistors. At least a portion of the decoder 315 may be included in the CuA layer 310. The CuA layer may be composed of silicon, and may include CMOS circuitry and interconnect components for operating the memory array 305.

In some examples, scaling down the size of memory cells in the memory array 305 may have one or more advantages. For example, by scaling down the size of the memory cells, the overall size of the memory array 305 may also be reduced. However, one or more components of the CuA layer 310 that may not be efficiently scaled down with the size of the memory array 305, such as CMOS transistors or other components of the decoder 315 or the CuA layer 310. To enable sufficient space for the decoder 315 as the memory array 305 is scaled down, the second stage 320-*b* may be included in a layer between the memory array 305 and the CuA layer 310. In some examples, the layer may also include the CMOS pre-decoding circuitry of the first stage 320-*a*. In some examples, the second stage 320-*b* of the decoder 315 may include CMOS transistors, where a CMOS transistor may include a p-type transistor and an n-type transistor with gates coupled to a common voltage source (e.g., a gate node). The CMOS transistor may control which voltage source is coupled with an access line based on a gate voltage applied to the p-type transistor and the n-type transistor. For example, a first gate voltage applied to the CMOS transistor may activate the p-type transistor, which may couple a source node with the access line and bias the access line to a source voltage. Similarly, a second gate voltage applied to the CMOS transistor may activate the n-type transistor, which may couple a ground node with the access line and bias the access line to a ground voltage. In some examples, the transistors may include TFTs, such as planar TFTs.

In some examples, the second stage 320-*b* may include alternative transistor configurations for decoding operations. For example, the second stage 320-*b* may include pairs of n-type transistors, where a first n-type transistor may be configured to selectively bias the access line to the source voltage (e.g., a positive voltage or a negative voltage), and the second n-type transistor may be configured to selectively bias the access line to the ground voltage. In some examples, the n-type transistors may be vertical transistors, extending in a direction perpendicular to a plane of the memory array 305. In some examples, the second stage 320-*b* may include an additional n-type transistor coupled with the n-type transistor or the p-type transistor in a cascode configuration. The additional n-type transistor act as a voltage clamp and reduce a likelihood of disturbing an adjacent line, which may enable further scaling down of the CuA layer 310 and the decoder 315.

Figure 4:
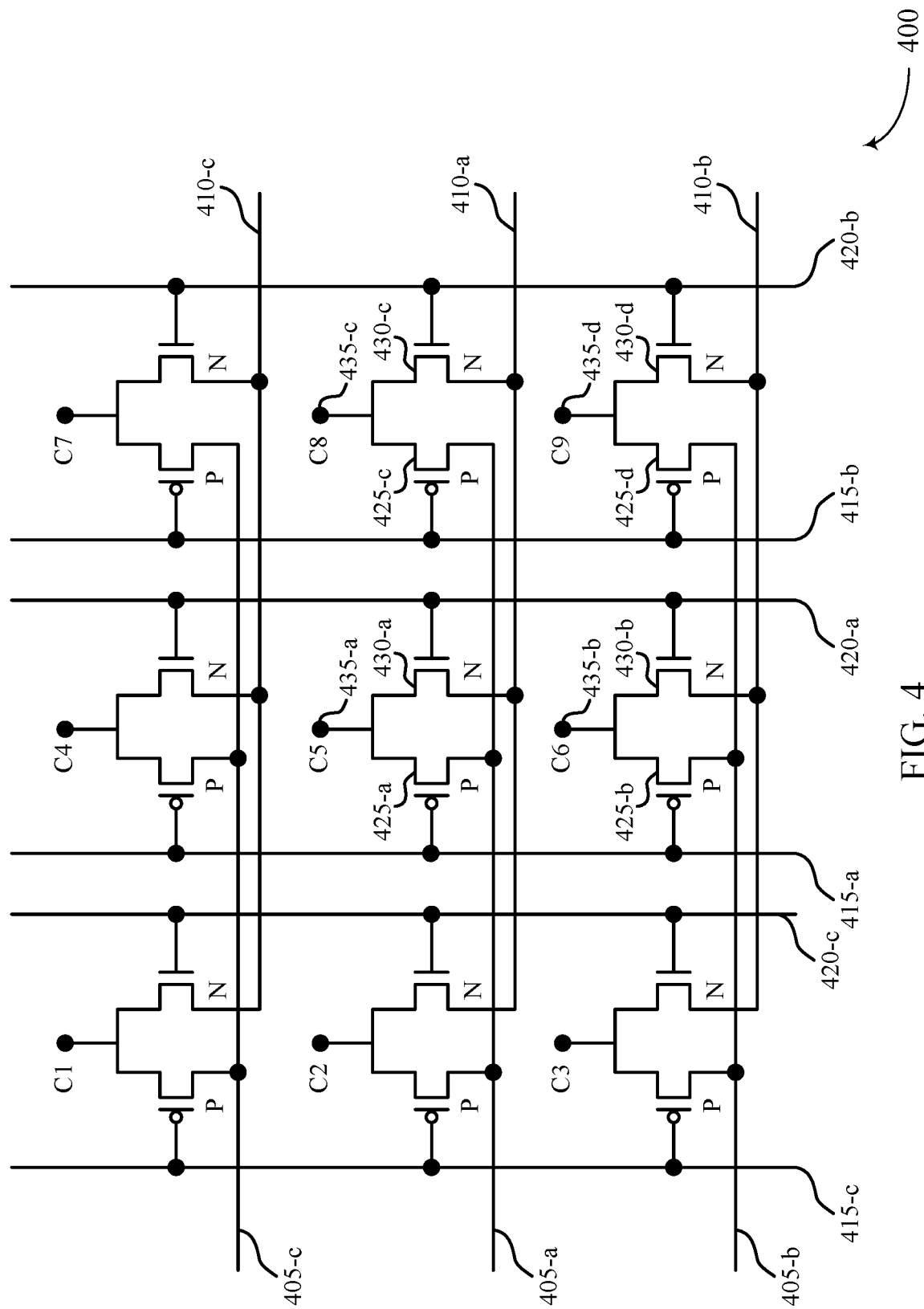
FIG. 4 illustrates an example of a biasing scheme that supports decoding for a memory device in accordance with examples as disclosed herein.

FIG. 4 illustrates an example of a circuit 400 showing a biasing scheme that supports decoding for a memory device in accordance with examples as disclosed herein. In some examples, the circuit 400 may include access lines 435, which may be examples of row lines 110 or column lines 115 described with reference to FIG. 1, and p-type transistors 425 and n-type transistors 430, which may be examples of components included in a second stage 320-*b* of a decoder 315 described with reference to FIG. 3.

The decoder biasing scheme illustrated by the circuit 400 that may include one or more source lines 405 and one or more ground lines 410. Source lines 405-*a* and 405-*b* may be selectively biased to a source voltage or a ground voltage and ground lines 410-*a* and 410-*b* may be biased to a ground voltage. Additionally, the decoder biasing scheme illustrated by the circuit 400 that may include one or more gate lines 415 and 420. The gate lines 415 may be coupled with gates of one or more p-type transistors 425. For example, a gate line 415-*a* may be coupled with gates of p-type transistors 425-*a* and 425-*b* and a gate line 415-*b* may be coupled with gates of p-type transistors 425-*c* and 425-*d*. The gate lines 420 may be coupled with gates of one or more n-type transistors 430. For example, a gate line 420-*a* may be coupled with gates of n-type transistors 430-*a* and 430-*b* and a gate line 420-*b* may be coupled with gates of n-type transistors 430-*c* and 430-*d*. In some examples, a p-type transistor 425 and a corresponding n-type transistor 430 may be configured as a CMOS transistor, where the gates of the p-type transistor 425 and the corresponding n-type transistor 430 are coupled with a common gate node. For example, the gate line 415-*a* and the gate line 420-*a* may be coupled with a common gate node to enable the p-type transistor 425-*a* and the n-type transistor 430-*a* to operate as a CMOS transistor for biasing the access line 435-*a*.

Each p-type transistor 425 may be coupled at a source terminal with a respective source line 405. For example, the p-type transistors 425-*a* and 425-*c* may be coupled with a source line 405-*a* and the p-type transistors 425-*b* and 425-*d* may be coupled with a source line 405-*b*. Similarly, each n-type transistor 430 may be coupled at a source terminal with a respective ground line 410. For example, the n-type transistors 430-*a* and 430-*c* may be coupled with a ground line 410-*a* and the n-type transistors 430-*b* and 430-*d* may be coupled with a ground line 410-*b*. Drain terminals of a p-type transistor 425 and a corresponding n-type transistor 430 operating as a CMOS transistor may be coupled with a respective access line 435. For example, the drain terminals of the p-type transistor 425-*a* and the n-type transistor 430-*a* may be coupled with the access line 435-*a*.

In some examples, each p-type transistor 425 may be operable to selectively couple a respective source line 405 with a respective access line 435. For example, the p-type transistor 425-*a* may selectively couple the source line 405-*a* with the access line 435-*a*. In some examples, each n-type transistor 430 may be operable to selective couple a respective ground line 410 with a respective access line 435. For example, the n-type transistor 430-*a* may selectively couple the ground line 410-*a* with the access line 435-*a*.

In some examples, one or more source lines 405 and one or more gate lines 415 and/or 420 may be selectively biased to bias an access line, such as the access line 435-*a*, to a source voltage (e.g., +3.1V). The source line 405-*a* may be biased to a first voltage (e.g., +3.1V) and one or more other source lines 405 (e.g., including the source line 405-*b*) may be biased to a ground voltage to maintain other access lines 435 (e.g., the access lines 435-*b* and 435-*d*) in a deactivated state. Additionally, the gate lines 415-*a* and 420-*a* may be biased to a second voltage, and the gate lines 415-*b* and 420-*b* may be biased to a third voltage. In an example positive biasing scheme (e.g., a scheme in which a positive pulse is applied to the access line 435-*a*), the second voltage applied to the gate lines 415-*a* and 420-*a* may be a ground voltage, which may activate the p-type transistor 425-*a* and deactivate the n-type transistor 430-*a* and couple the source line 405-*a* to the access line 435-*a*. In an example alternative biasing scheme, a third voltage (e.g., a positive voltage) may be applied to the gate lines 415-*a* and 420-*a*, which may activate the n-type transistor 430-*a* and deactivate the n-type transistor 430-*a* and couple the ground line 410-*a* to the access line 435-*a*. In some examples, each source line 405 may be biased by a first stage of a decoder (e.g., a first stage 320-*a* of a decoder 315 described with reference to FIG. 3).

Figure 5:
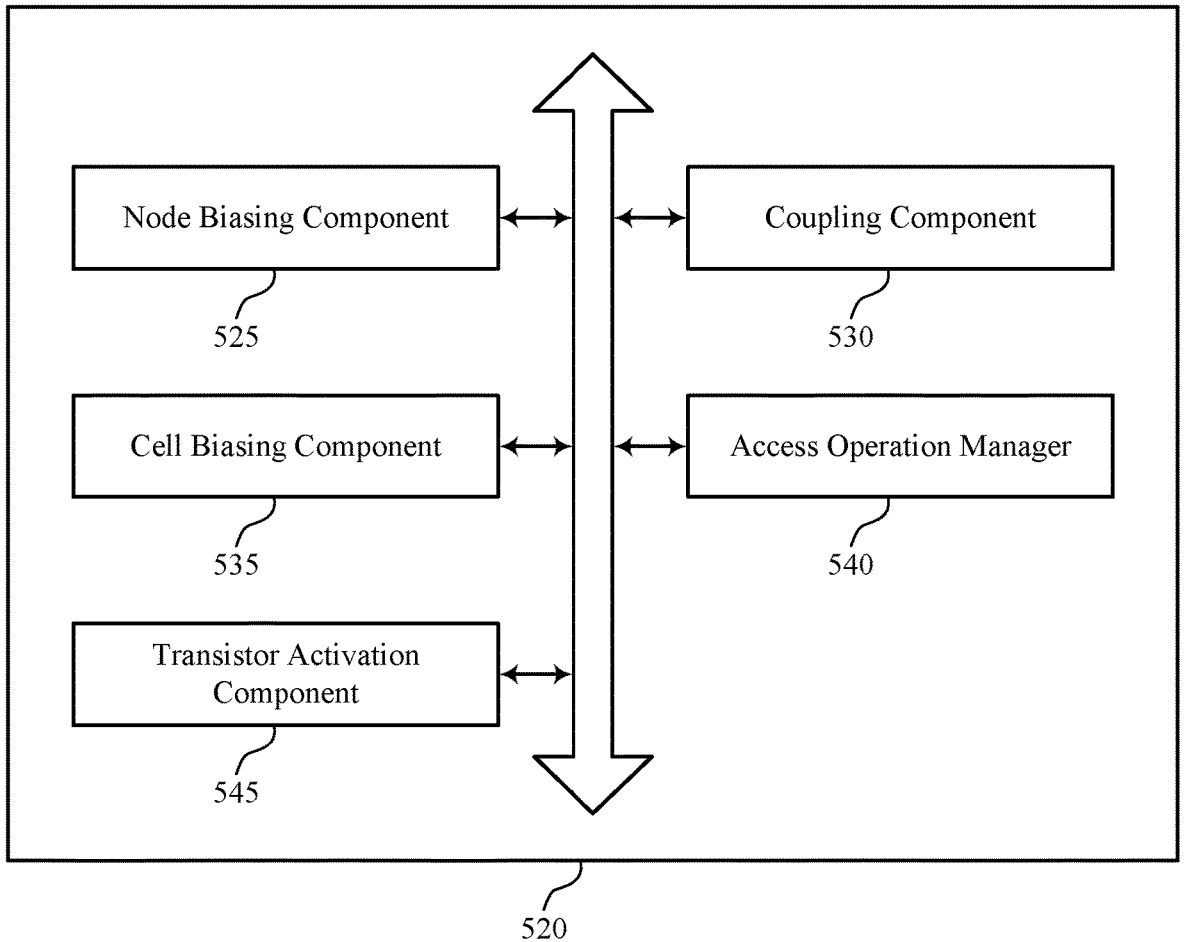
FIG. 5 shows a block diagram of a memory device that supports decoding for a memory device in accordance with examples as disclosed herein.

FIG. 5 shows a block diagram 500 of a memory device 520 that supports decoding for a memory device in accordance with examples as disclosed herein. The memory device 520 may be an example of aspects of a memory device as described with reference to FIGS. 1 through 4. The memory device 520, or various components thereof, may be an example of means for performing various aspects of decoding for a memory device as described herein. For example, the memory device 520 may include a node biasing component 525, a coupling component 530, a cell biasing component 535, an access operation manager 540, a transistor activation component 545, or any combination thereof. Each of these components may communicate, directly or indirectly, with one another (e.g., via one or more buses).

The node biasing component 525 may be configured as or otherwise support a means for biasing, using a first stage of a decoder, a source node to a first voltage as part of an access operation on a memory array. The coupling component 530 may be configured as or otherwise support a means for coupling, using a second stage of the decoder, the source node or a ground node with an access line of the memory array. The cell biasing component 535 may be configured as or otherwise support a means for biasing a memory cell of the memory array coupled with the access line based at least in part on coupling the source node or the ground node with the access line. The access operation manager 540 may be configured as or otherwise support a means for performing the access operation on the memory cell based at least in part on biasing the memory cell.

In some examples, to support coupling the source node or the ground node with the access line, the node biasing component 525 may be configured as or otherwise support a means for biasing a gate node to a second voltage or a third voltage, the gate node coupled with a first gate of a p-type transistor and a second gate of an n-type transistor.

In some examples, to support coupling the source node or the ground node with the access line, the transistor activation component 545 may be configured as or otherwise support a means for activating the p-type transistor based at least in part on biasing the gate node to the second voltage, where the source node is coupled with the access line based at least in part on activating the p-type transistor.

In some examples, to support coupling the source node or the ground node with the access line, the transistor activation component 545 may be configured as or otherwise support a means for activating the n-type transistor based at least in part on biasing the gate node to the third voltage, where the ground node is coupled with the access line based at least in part on activating the n-type transistor.

In some examples, to support coupling the source node or the ground node with the access line, the transistor activation component 545 may be configured as or otherwise support a means for activating a second n-type transistor coupled with the p-type transistor, the n-type transistor, and the access line, where the source node or the ground node is coupled with the access line based at least in part on activating the second n-type transistor.

Figure 6:
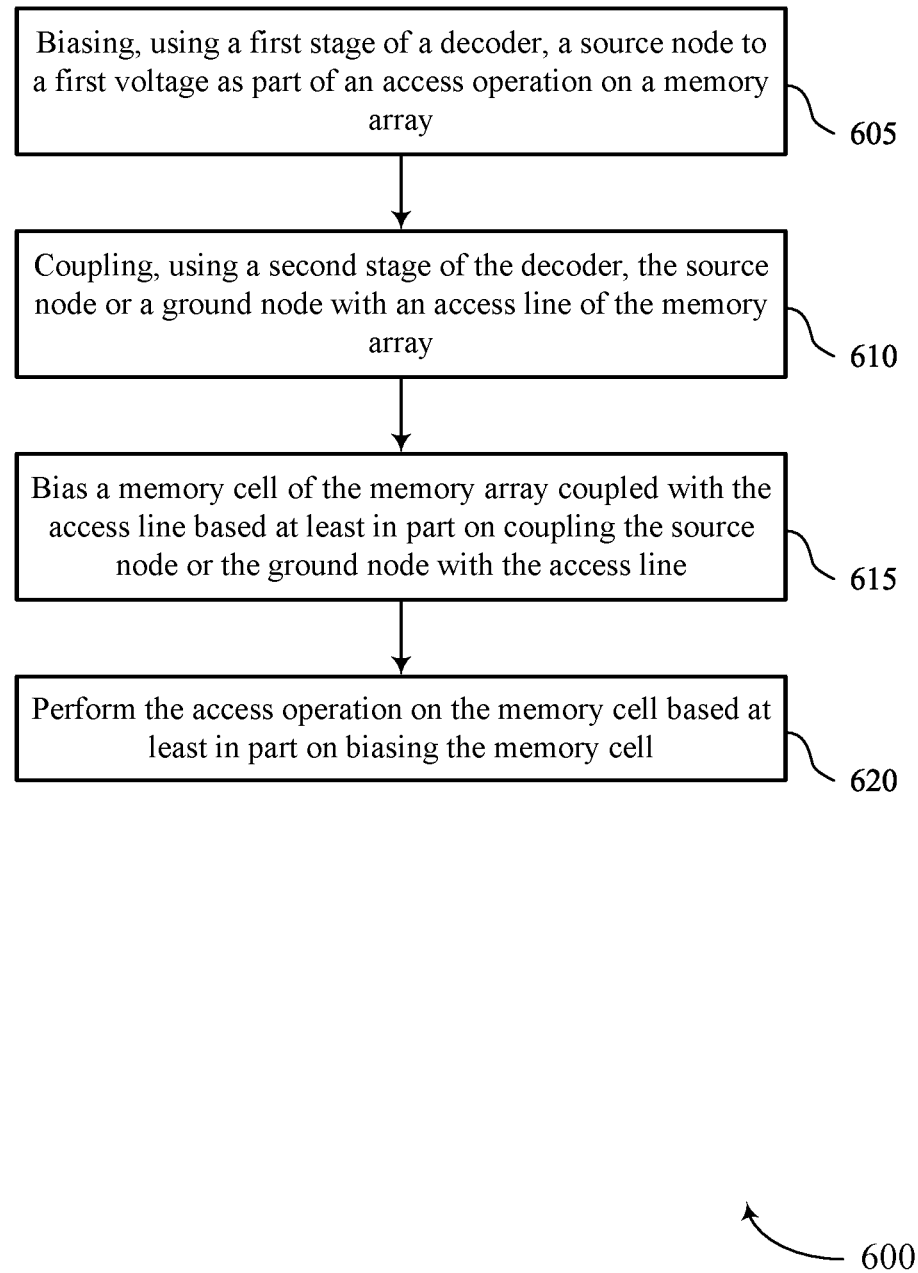
FIG. 6 shows a flowchart illustrating a method or methods that support decoding for a memory device in accordance with examples as disclosed herein.

FIG. 6 shows a flowchart illustrating a method 600 that supports decoding for a memory device in accordance with examples as disclosed herein. The operations of method 600 may be implemented by a memory device or its components as described herein. For example, the operations of method 600 may be performed by a memory device as described with reference to FIGS. 1 through 5. In some examples, a memory device may execute a set of instructions to control the functional elements of the device to perform the described functions. Additionally or alternatively, the memory device may perform aspects of the described functions using special-purpose hardware.

At 605, the method may include biasing, using a first stage of a decoder, a source node to a first voltage as part of an access operation on a memory array. The operations of 605 may be performed in accordance with examples as disclosed herein. In some examples, aspects of the operations of 605 may be performed by a node biasing component 525 as described with reference to FIG. 5.

At 610, the method may include coupling, using a second stage of the decoder, the source node or a ground node with an access line of the memory array. The operations of 610 may be performed in accordance with examples as disclosed herein. In some examples, aspects of the operations of 610 may be performed by a coupling component 530 as described with reference to FIG. 5.

At 615, the method may include biasing a memory cell of the memory array coupled with the access line based at least in part on coupling the source node or the ground node with the access line. The operations of 615 may be performed in accordance with examples as disclosed herein. In some examples, aspects of the operations of 615 may be performed by a cell biasing component 535 as described with reference to FIG. 5.

At 620, the method may include performing the access operation on the memory cell based at least in part on biasing the memory cell. The operations of 620 may be performed in accordance with examples as disclosed herein. In some examples, aspects of the operations of 620 may be performed by an access operation manager 540 as described with reference to FIG. 5.

In some examples, an apparatus as described herein may perform a method or methods, such as the method 600. The apparatus may include, features, circuitry, logic, means, or instructions (e.g., a non-transitory computer-readable medium storing instructions executable by a processor) for biasing, using a first stage of a decoder, a source node to a first voltage as part of an access operation on a memory array, coupling, using a second stage of the decoder, the source node or a ground node with an access line of the memory array, biasing a memory cell of the memory array coupled with the access line based at least in part on coupling the source node or the ground node with the access line, and performing the access operation on the memory cell based at least in part on biasing the memory cell.

In some examples of the method 600 and the apparatus described herein, coupling the source node or the ground node with the access line may include operations, features, circuitry, logic, means, or instructions for biasing a gate node to a second voltage or a third voltage, the gate node coupled with a first gate of a p-type transistor and a second gate of an n-type transistor.

In some examples of the method 600 and the apparatus described herein, coupling the source node or the ground node with the access line may include operations, features, circuitry, logic, means, or instructions for activating the p-type transistor based at least in part on biasing the gate node to the second voltage, where the source node may be coupled with the access line based at least in part on activating the p-type transistor.

In some examples of the method 600 and the apparatus described herein, coupling the source node or the ground node with the access line may include operations, features, circuitry, logic, means, or instructions for activating the n-type transistor based at least in part on biasing the gate node to the third voltage, where the ground node may be coupled with the access line based at least in part on activating the n-type transistor.

In some examples of the method 600 and the apparatus described herein, coupling the source node or the ground node with the access line may include operations, features, circuitry, logic, means, or instructions for activating a second n-type transistor coupled with the p-type transistor, the n-type transistor, and the access line, where the source node or the ground node may be coupled with the access line based at least in part on activating the second n-type transistor.

It should be noted that the methods described herein describe possible implementations, and that the operations and the steps may be rearranged or otherwise modified and that other implementations are possible. Furthermore, portions from two or more of the methods may be combined.

An apparatus is described. The apparatus may include a memory array including a memory cell and an access line coupled with the memory cell and a decoder coupled with the access line and configured to bias the access line to one or more voltages, the decoder including a p-type transistor coupled with a source node and the access line, the source node configured to bias the access line to a first voltage based at least in part on operation of the p-type transistor and an n-type transistor coupled with a ground node and the access line, the ground node configured to bias the access line to a ground voltage based at least in part on operation of the n-type transistor In some examples of the apparatus, the p-type transistor includes a first gate coupled with a gate node, a first source terminal coupled with the source node, and a first drain terminal coupled with the access line, the n-type transistor includes a second gate coupled with the gate node, a second drain terminal coupled with the ground node, and a second source terminal coupled with the access line, and the decoder may be further configured to bias the gate node to a second voltage or a third voltage.

In some examples of the apparatus, a die of the memory array extends in a first direction and a second direction and the p-type transistor and the n-type transistor may be planar transistors extending in the first direction and the second direction.

In some examples of the apparatus, the source node may be further configured to bias the access line to the first voltage based at least in part on the gate node being biased to the second voltage.

In some examples of the apparatus, the ground node may be further configured to bias the access line to the ground voltage based at least in part on the gate node being biased to the third voltage.

In some examples of the apparatus, the first source terminal of the p-type transistor may be coupled with the source node, the second drain terminal of the n-type transistor may be coupled with the ground node, and the first drain terminal of the p-type transistor and the second source terminal of the n-type transistor may be coupled with the access line.

In some examples of the apparatus, the decoder further includes a second n-type transistor coupled with the p-type transistor, the n-type transistor, and the access line, where the second n-type transistor may be arranged in a cascode configuration with the p-type transistor or the n-type transistor.

Another apparatus is described. The apparatus may include a substrate extending in a first direction and a second direction, a memory array including a memory cell, a digit line coupled with the memory cell, and a word line coupled with the memory cell and extending in the second direction parallel with the substrate, and a decoder coupled with the digit line and including a first stage and a second stage, the first stage of the decoder positioned in a first layer including one or more logic circuits associated with operating the memory array, the second stage of the decoder positioned in a second layer between the first layer and the memory array, the second stage of the decoder including a p-type transistor coupled with a source node and the digit line, the source node configured to bias the digit line to a first voltage based at least in part on operation of the p-type transistor, the p-type transistor including a first doped material and an n-type transistor coupled with a ground node and the digit line, the ground node configured to bias the digit line to a ground voltage based at least in part on operation of the n-type transistor, the n-type transistor including a second doped material In some examples of the apparatus, the p-type transistor and the n-type transistor extend in the first direction and the second direction.

In some examples of the apparatus, the p-type transistor includes a first gate coupled with a gate node, the n-type transistor includes a second gate coupled with the gate node, and the first stage of the decoder may be configured to bias the gate node to a second voltage or a third voltage.

In some examples of the apparatus, the source node may be further configured to bias the digit line to the first voltage based at least in part on the gate node being biased to the second voltage.

In some examples of the apparatus, the ground node may be further configured to bias the digit line to the ground voltage based at least in part on the gate node being biased to the third voltage.

In some examples of the apparatus, the p-type transistor may be coupled with the source node via a first conductive line extending in the first direction, the n-type transistor may be coupled with the ground node via a second conductive line extending in the first direction and parallel to the first conductive line, and the p-type transistor and the n-type transistor may be coupled with the digit line via a third conductive line extending the second direction.

In some examples of the apparatus, the decoder further includes a second n-type transistor coupled with the p-type transistor, the n-type transistor, and the digit line, where the second n-type transistor may be arranged in a cascode configuration with the p-type transistor or the n-type transistor.

Another apparatus is described. The apparatus may include a memory array, a decoder including a first stage and a second stage and coupled with the memory array, and a controller coupled with the decoder and the memory array, the controller operable to cause the apparatus to bias, using the first stage of the decoder, a source node to a first voltage as part of an access operation on the memory array, couple, using the second stage of the decoder, the source node or a ground node with an access line of the memory array, bias a memory cell of the memory array coupled with the access line based at least in part on coupling the source node or the ground node with the access line, and perform the access operation on the memory cell based at least in part on biasing the memory cell In some examples of the apparatus, the second stage of the decoder includes a p-type transistor and an n-type transistor and the controller may be further operable to cause the apparatus to.

In some examples of the apparatus, a die of the memory array extends in a first direction and a second direction and the p-type transistor and the n-type transistor may be planar transistors extending in the first direction and the second direction.

In some examples of the apparatus, the controller may be further operable to cause the apparatus to activate the p-type transistor based at least in part on biasing the gate node to the second voltage, where the source node may be coupled with the access line based at least in part on activating the p-type transistor.

In some examples of the apparatus, the controller may be further operable to cause the apparatus to activate the n-type transistor based at least in part on biasing the gate node to the third voltage, where the ground node may be coupled with the access line based at least in part on activating the n-type transistor.

In some examples of the apparatus, the second stage of the decoder further includes a second n-type transistor coupled with the p-type transistor, the n-type transistor, and the access line and the controller may be further operable to cause the apparatus to.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, and/or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a memory array comprising:
a memory cell;
an access line coupled with the memory cell; and
a decoder coupled with the access line and configured to bias the access line to one or more voltages, the decoder comprising:
a p-type transistor coupled with a source node and the access line, the source node configured to bias the access line to a first voltage based at least in part on operation of the p-type transistor; and
an n-type transistor coupled with a ground node and the access line, the ground node configured to bias the access line to a ground voltage based at least in part on operation of the n-type transistor.

2. The apparatus of claim 1, wherein:
the p-type transistor comprises a first gate coupled with a gate node, a first source terminal coupled with the source node, and a first drain terminal coupled with the access line;
the n-type transistor comprises a second gate coupled with the gate node, a second drain terminal coupled with the ground node, and a second source terminal coupled with the access line; and
the decoder is further configured to bias the gate node to a second voltage or a third voltage.

3. The apparatus of claim 2, wherein:
a die of the memory array extends in a first direction and a second direction; and
the p-type transistor and the n-type transistor are planar transistors extending in the first direction and the second direction.

4. The apparatus of claim 2, wherein the source node is further configured to bias the access line to the first voltage based at least in part on the gate node being biased to the second voltage.

5. The apparatus of claim 2, wherein the ground node is further configured to bias the access line to the ground voltage based at least in part on the gate node being biased to the third voltage.

6. The apparatus of claim 2, wherein:
the first source terminal of the p-type transistor is coupled with the source node;
the second drain terminal of the n-type transistor is coupled with the ground node; and
the first drain terminal of the p-type transistor and the second source terminal of the n-type transistor are coupled with the access line.

7. The apparatus of claim 1, wherein the decoder further comprises:
a second n-type transistor coupled with the p-type transistor, the n-type transistor, and the access line, wherein the second n-type transistor is arranged in a cascode configuration with the p-type transistor or the n-type transistor.

8. An apparatus, comprising:
a substrate extending in a first direction and a second direction;
a memory array comprising:
a memory cell;
a digit line coupled with the memory cell;
a word line coupled with the memory cell and extending in the second direction parallel with the substrate; and
a decoder coupled with the digit line and comprising a first stage and a second stage, the first stage of the decoder positioned in a first layer comprising one or more logic circuits associated with operating the memory array, the second stage of the decoder positioned in a second layer between the first layer and the memory array, the second stage of the decoder comprising:
a p-type transistor coupled with a source node and the digit line, the source node configured to bias the digit line to a first voltage based at least in part on operation of the p-type transistor, the p-type transistor comprising a first doped material; and
an n-type transistor coupled with a ground node and the digit line, the ground node configured to bias the digit line to a ground voltage based at least in part on operation of the n-type transistor, the n-type transistor comprising a second doped material.

9. The apparatus of claim 8, wherein the p-type transistor and the n-type transistor extend in the first direction and the second direction.

10. The apparatus of claim 8, wherein:
the p-type transistor comprises a first gate coupled with a gate node;
the n-type transistor comprises a second gate coupled with the gate node; and
the first stage of the decoder is configured to bias the gate node to a second voltage or a third voltage.

11. The apparatus of claim 10, wherein the source node is further configured to bias the digit line to the first voltage based at least in part on the gate node being biased to the second voltage.

12. The apparatus of claim 10, wherein the ground node is further configured to bias the digit line to the ground voltage based at least in part on the gate node being biased to the third voltage.

13. The apparatus of claim 8, wherein:
the p-type transistor is coupled with the source node via a first conductive line extending in the first direction;
the n-type transistor is coupled with the ground node via a second conductive line extending in the first direction and parallel to the first conductive line; and
the p-type transistor and the n-type transistor are coupled with the digit line via a third conductive line extending the second direction.

14. The apparatus of claim 8, wherein the decoder further comprises:
a second n-type transistor coupled with the p-type transistor, the n-type transistor, and the digit line, wherein the second n-type transistor is arranged in a cascode configuration with the p-type transistor or the n-type transistor.

15. A method, comprising:
biasing, using a first stage of a decoder, a source node to a first voltage as part of an access operation on a memory array;
coupling, using a second stage of the decoder, the source node or a ground node with an access line of the memory array;
biasing a memory cell of the memory array coupled with the access line based at least in part on coupling the source node or the ground node with the access line; and
performing the access operation on the memory cell based at least in part on biasing the memory cell.

16. The method of claim 15, wherein coupling the source node or the ground node with the access line comprises:
biasing a gate node to a second voltage or a third voltage, the gate node coupled with a first gate of a p-type transistor and a second gate of an n-type transistor.

17. The method of claim 16, wherein coupling the source node or the ground node with the access line comprises:
activating the p-type transistor based at least in part on biasing the gate node to the second voltage, wherein the source node is coupled with the access line based at least in part on activating the p-type transistor.

18. The method of claim 16, wherein coupling the source node or the ground node with the access line comprises:
activating the n-type transistor based at least in part on biasing the gate node to the third voltage, wherein the ground node is coupled with the access line based at least in part on activating the n-type transistor.

19. The method of claim 16, wherein coupling the source node or the ground node with the access line comprises:
activating a second n-type transistor coupled with the p-type transistor, the n-type transistor, and the access line, wherein the source node or the ground node is coupled with the access line based at least in part on activating the second n-type transistor.

20. An apparatus, comprising:
a memory array;
a decoder comprising a first stage and a second stage and coupled with the memory array; and
a controller coupled with the decoder and the memory array, the controller operable to cause the apparatus to:
bias, using the first stage of the decoder, a source node to a first voltage as part of an access operation on the memory array;
couple, using the second stage of the decoder, the source node or a ground node with an access line of the memory array;
bias a memory cell of the memory array coupled with the access line based at least in part on coupling the source node or the ground node with the access line; and
perform the access operation on the memory cell based at least in part on biasing the memory cell.

21. The apparatus of claim 20, wherein:
the second stage of the decoder comprises a p-type transistor and an n-type transistor; and
the controller is further operable to cause the apparatus to:
bias a gate node to a second voltage or a third voltage, the gate node coupled with a first gate of the p-type transistor and a second gate of the n-type transistor, wherein the source node or the ground node is coupled with the access line based at least in part on biasing the gate node to the second voltage or the third voltage.

22. The apparatus of claim 21, wherein:
a die of the memory array extends in a first direction and a second direction; and
the p-type transistor and the n-type transistor are planar transistors extending in the first direction and the second direction.

23. The apparatus of claim 21, wherein the controller is further operable to cause the apparatus to:
activate the p-type transistor based at least in part on biasing the gate node to the second voltage, wherein the source node is coupled with the access line based at least in part on activating the p-type transistor.

24. The apparatus of claim 21, wherein the controller is further operable to cause the apparatus to:
activate the n-type transistor based at least in part on biasing the gate node to the third voltage, wherein the ground node is coupled with the access line based at least in part on activating the n-type transistor.

25. The apparatus of claim 21, wherein:
the second stage of the decoder further comprises a second n-type transistor coupled with the p-type transistor, the n-type transistor, and the access line; and
the controller is further operable to cause the apparatus to:
activate the second n-type transistor, wherein the source node or the ground node is coupled with the access line based at least in part on activating the second n-type transistor.

* * * * *